United States Patent
Nayuki et al.

(10) Patent No.: US 11,090,766 B2
(45) Date of Patent: Aug. 17, 2021

(54) LASER PROCESSING APPARATUS

(71) Applicant: DISCO CORPORATION, Tokyo (JP)

(72) Inventors: Masatoshi Nayuki, Tokyo (JP); Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 335 days.

(21) Appl. No.: 16/048,608

(22) Filed: Jul. 30, 2018

(65) Prior Publication Data

US 2019/0039185 A1 Feb. 7, 2019

(30) Foreign Application Priority Data

Aug. 4, 2017 (JP) ............................. JP2017-151256

(51) Int. Cl.
*B23K 26/364* (2014.01)
*H01L 21/687* (2006.01)
*H01L 21/67* (2006.01)
*B23K 101/40* (2006.01)
*H01L 21/78* (2006.01)

(52) U.S. Cl.
CPC ...... *B23K 26/364* (2015.10); *H01L 21/67092* (2013.01); *H01L 21/68785* (2013.01); *B23K 2101/40* (2018.08); *H01L 21/78* (2013.01)

(58) Field of Classification Search
CPC ...... B23K 26/364; B23K 26/53; B23K 26/55; B23K 26/0821; B23K 26/0648
USPC ............. 219/121.69, 121.67, 121.68; 216/65
See application file for complete search history.

(56) References Cited

U.S. PATENT DOCUMENTS

| 6,800,859 B1* | 10/2004 | Shishido | ................... G01J 3/10 250/372 |
| 9,796,049 B2* | 10/2017 | Nomaru | ................ B23K 26/364 |
| 2010/0181706 A1* | 7/2010 | Ruuttu | ................ B23K 26/0624 264/400 |
| 2016/0096237 A1* | 4/2016 | Nomaru | ................ B23K 26/364 219/121.68 |

FOREIGN PATENT DOCUMENTS

JP 10305420 A 11/1998

* cited by examiner

*Primary Examiner* — Dana Ross
*Assistant Examiner* — Michael S. Poetzinger
(74) *Attorney, Agent, or Firm* — Greer Burns & Crain Ltd.

(57) ABSTRACT

A laser processing apparatus for processing a wafer along projected dicing lines with a laser beam has a laser oscillator, a polygon mirror having a plurality of reflecting surfaces and rotatable about a central axis thereof, and an fθ lens for focusing the beam reflected by the reflecting surfaces of the polygon mirror and applying the focused beam to the wafer. The reflecting surfaces of the polygon mirror include a zero-gradient reflecting surface lying at a zero gradient parallel to the central axis, a positive-gradient reflecting surface that is inclined at a positive gradient from the zero gradient, and a negative-gradient reflecting surface that is inclined at a negative gradient from the zero gradient. The polygon mirror swings the laser beam in a direction perpendicular to a processing feed direction within the width of each of the projected dicing lines and in the processing feed direction.

5 Claims, 4 Drawing Sheets

LASER PROCESSING APPARATUS

BACKGROUND OF THE INVENTION

Field of the Invention

The present invention relates to a laser processing apparatus for processing a wafer along projected dicing lines thereon with a laser beam.

Description of the Related Art

Wafers have a grid of projected dicing lines formed on their surfaces and various devices such as integrated circuits (ICs), large scale integration (LSI) circuits, etc. formed in areas demarcated on the surfaces by the projected dicing lines. There has been known a laser processing apparatus for processing such a wafer by applying a laser beam thereto along the projected dicing lines to perform an ablation process on the wafer (see, for example, Japanese Patent Laid-Open No. 1998-305420). In the ablation process, a laser beam having a wavelength that can be absorbed by the wafer is applied to the wafer along the projected dicing lines to form grooves along the projected dicing lines by partially removing the material of the wafer from the regions where the laser beam is applied.

SUMMARY OF THE INVENTION

The projected dicing lines on different types of wafers have different widths depending on the types of the wafers. For processing a wafer having wider projected dicing lines thereon with a laser beam, it is necessary that the laser beam traverse across the projected dicing lines. Generally, it is possible to cause a laser beam to traverse across projected dicing lines to make groove widths variable, using a pair of galvano scanners and an fθ lens. However, a laser processing apparatus that incorporates a pair of galvano scanners and an fθ lens is complex in arrangement as the mirrors of the galvano scanners need to change their angles at a high speed to cause the laser beam to traverse across the projected dicing lines. In addition, there has been a demand for higher speeds at which the laser beam traverses across the projected dicing lines.

It is therefore an object of the present invention to provide a laser processing apparatus which incorporates a simple arrangement for causing a laser beam to traverse across the projected dicing lines on a wafer at an increased speed.

In accordance with an aspect of the present invention, there is provided a laser processing apparatus for processing a wafer with a laser beam which is focused and applied to the wafer along a plurality of intersecting projected dicing lines on a surface thereof which demarcate the surface into a plurality of areas with devices formed therein. The laser processing apparatus includes a chuck table configured to hold the wafer thereon, a laser processing unit configured to focus and apply a laser beam having a wavelength that can be absorbed by the wafer, along the projected dicing lines on the wafer held on the chuck table, thereby forming processed grooves in the wafer, and a processing feed unit configured to processing-feed the chuck table and the laser processing unit relatively to each other in a processing feed direction. The laser processing unit includes a laser oscillator for emitting the laser beam, a polygon mirror rotatable about a central axis thereof and having a plurality of reflecting surfaces, and an fθ lens for focusing the laser beam reflected by the reflecting surfaces of the polygon mirror and applying the focused laser beam to the wafer. The reflecting surfaces of the polygon mirror include a zero-gradient reflecting surface lying at a zero gradient parallel to the central axis, a positive-gradient reflecting surface that is inclined at a positive gradient from the zero gradient, and a negative-gradient reflecting surface that is inclined at a negative gradient from the zero gradient, and wherein the polygon mirror swings the laser beam in a direction perpendicular to the processing feed direction within the width of each of the projected dicing lines and in the processing feed direction.

With the above arrangement, when the laser beam is applied to the polygon mirror that is rotating about the central axis, the laser beam is reflected successively by the zero-gradient reflecting surface, the positive-gradient reflecting surface, and the negative-gradient reflecting surface. As the zero-gradient reflecting surface, the positive-gradient reflecting surface, and the negative-gradient reflecting surface switch to reflect the laser beam upon rotation of the polygon mirror, and the angle of reflection by which each of the reflecting surfaces reflects the laser beam varies upon rotation of the polygon mirror, the laser beam is swung within the width of each of the projected dicing lines in the direction perpendicular to the processing feed direction and also in the processing feed direction. The speed at which the laser beam is swung is determined depending on the speed at which the polygon mirror is rotated. Therefore, the laser beam can be swung and the speed at which the laser beam is swung can be increased by a simple arrangement.

According to the present invention, since the polygon mirror includes the zero-gradient reflecting surface, the positive-gradient reflecting surface, and the negative-gradient reflecting surface, the polygon mirror can swing the laser beam within the width of each of the projected dicing lines in the direction perpendicular to the processing feed direction and also in the processing feed direction with a simple arrangement.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
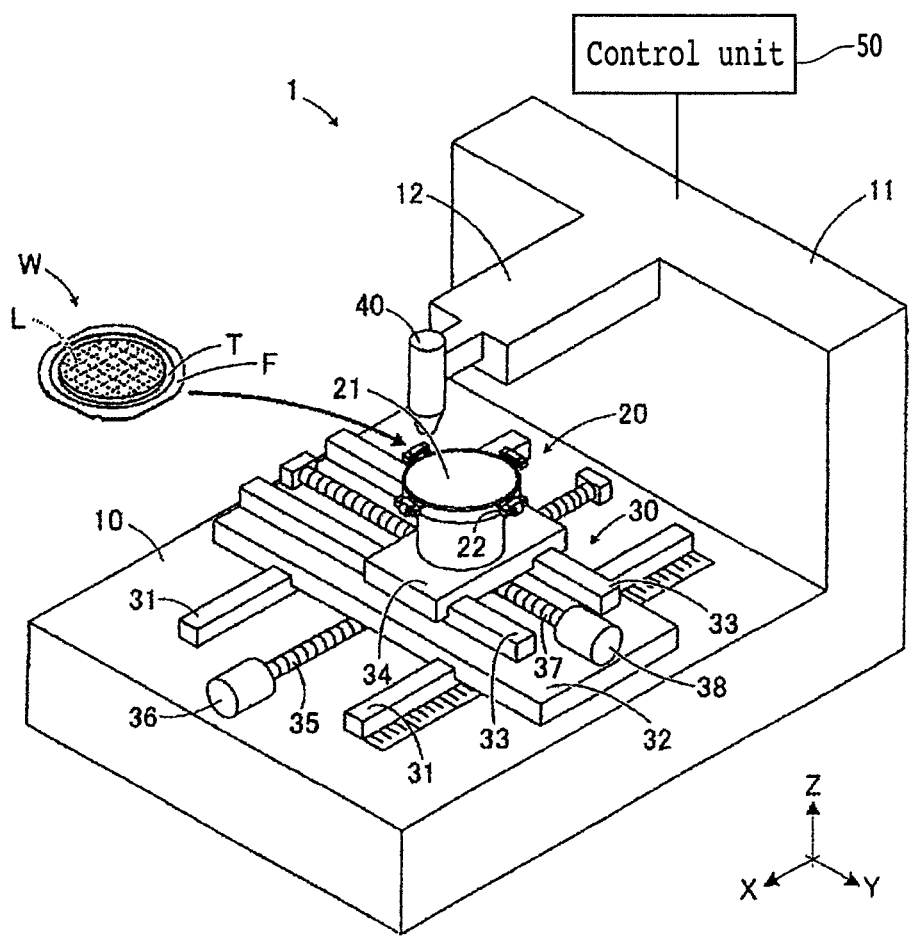
FIG. 1 is a perspective view of a laser processing apparatus according to an embodiment of the present invention.
Figure 2A:
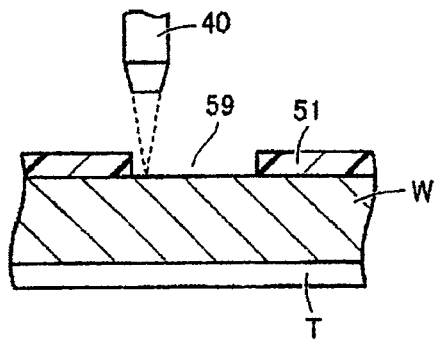
FIGS. 2A and 2B are enlarged fragmentary cross-sectional views illustrating by way of example a laser processing process according to a comparative example.
Figure 2B:
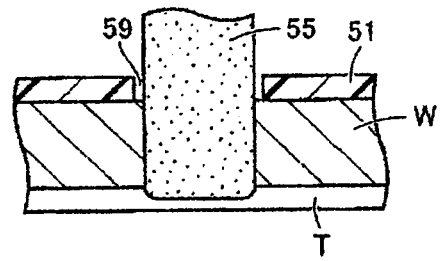

A laser processing apparatus according to an embodiment of the present invention will be described below with reference to the drawings. FIG. 1 is a perspective view of the laser processing apparatus and FIGS. 2A and 2B are enlarged fragmentary cross-sectional views illustrating by way of example a laser processing process according to a comparative example. The laser processing apparatus may be of any configurations capable of carrying out a laser processing process according to the embodiment of the present invention, and is not limited to the configuration depicted in FIG. 1.

As depicted in FIG. 1, a laser processing apparatus, denoted by 1, is arranged to process a wafer W with a laser beam while relatively moving a laser processing unit 40 that applies the laser beam to the wafer W and a chuck table 20 that holds the wafer W thereon. The wafer W has on a face side thereof a grid of projected dicing lines L that demarcate the face side into a plurality of areas with devices formed individually therein. The wafer W has a reverse side stuck to a central region of a protective tape T. The protective tape T has an outer peripheral region stuck to and supported by an annular frame F. The wafer W may be a semiconductor wafer including a plurality of semiconductor devices formed on a semiconductor substrate or an optical device wafer including a plurality of optical devices formed on a substrate of inorganic material.

The laser processing apparatus 1 includes a base 10 supporting thereon a processing feed unit 30 for processing-feeding the chuck table 20 in an X-axis direction and a Y-axis direction with respect to the laser processing unit 40. The processing feed unit 30 has a pair of guide rails 31 disposed on the base 10 and extending parallel to the X-axis direction and a motor-driven X-axis table 32 slidably mounted on the guide rails 31. The processing feed unit 30 also has a pair of guide rails 33 disposed on an upper surface of the X-axis table 32 and extending parallel to the Y-axis direction and a motor-driven Y-axis table 34 slidably mounted on the guide rails 33. The chuck table 20 for supporting the wafer W thereon is mounted on the Y-axis table 34.

The X-axis table 32 and the Y-axis table 34 have respective nuts, not depicted, disposed on their lower surfaces and threaded over respective ball screws 35 and 37 parallel to the respective pairs of guide rails 31 and 33. When drive motors 36 and 38 mounted respectively on the base 10 and the X-axis table 32 and coupled to respective ends of the ball screws 35 and 37 are energized, the ball screws 35 and 37 are rotated about their own axes, moving the X-axis table 32 in the X-axis direction along the guide rails 31 and moving the Y-axis table 34 and hence the chuck table 20 in the Y-axis direction along the guide rails 33. The chuck table 20 has an upper surface serving as a holding surface 21, and is surrounded by a plurality of clamps 22 for gripping and securing the annular frame F around the wafer W to hold the wafer W on the holding surface 21.

An arm 12 projects horizontally in a cantilevered fashion from a rear upstanding wall 11 disposed on the base 10 behind the chuck table 20. The laser processing unit 40 for performing an ablation process on the wafer W held on the chuck table 20 is mounted on a distal end of the arm 12. In the ablation process, the laser processing unit 40 serves to form processed grooves in the wafer W by applying a focused spot of a laser beam having a wavelength that is absorbable by the wafer W to the wafer W along the projected dicing lines L thereon. The ablation process refers to a process in which when the intensity of a laser beam applied to a solid object becomes larger than a predetermined threshold value, electrons in the surface of the solid object are converted into thermal, photochemical, and mechanical energy, resulting in an explosive emission of neutral atoms, molecules, positive and negative ions, radicals, clusters, electrons, and light thereby to etch the surface of the solid object.

The laser processing unit 1 further includes a control unit 50 for controlling various components thereof in an integrated fashion. The control unit 50 has a processor for performing various processing sequences, a memory for storing programs and data, and other devices. The memory may include one or more storage media such as a read only memory (ROM), a random access memory (RAM), etc. The memory stores control programs for controlling the components of the laser processing unit 1 and data such as laser processing conditions and so on. The laser processing apparatus 1 carries out the ablation process along the projected dicing lines L on the wafer W while the chuck table 20 is being processing-fed with respect to the laser processing unit 40.

As indicated by a comparative example depicted in FIG. 2A, a wafer W with a low-k film 51 is divided into device chips by a combination of an ablation process and a mechanical dicing process because the low-k film 51 tends to be peeled off if the wafer W is divided by a mechanical dicing process only. In the ablation process, a laser beam is applied to the wafer W to remove a strip of the low-k film 51 along a projected dicing line L (see FIG. 1) while the wafer W is processing-fed in a direction perpendicular to the sheet of FIG. 2A. The wafer W is repeatedly processing-fed in reciprocating strokes to form a processed groove 59 having a desired width over the surface of the wafer W according to the ablation process. The surface of the wafer W is exposed through the processed groove 59 from which the low-k film 51 has been removed.

In the ablation process, as depicted in FIG. 2B, the processed groove 59 needs to be formed along the projected dicing line L (see FIG. 1) to a width larger than the width of a cutting blade 55 so that the cutting blade 55 will not contact the low-k film 51 in the mechanical dicing process. In order to form the wider processed groove 59 along the projected dicing line L, it is necessary to processing-feed the wafer W repeatedly in reciprocating strokes along the projecting dicing line L. When a relatively wide processed groove is to be formed in a wafer along a projected dicing line regardless of whether the wafer has a low-k film or not, the wafer needs to be processing-fed repeatedly in reciprocating strokes. Consequently, the period of time required to perform the ablation process on the wafer W or a wafer free of a low-k film is liable to be long.

Figure 3:
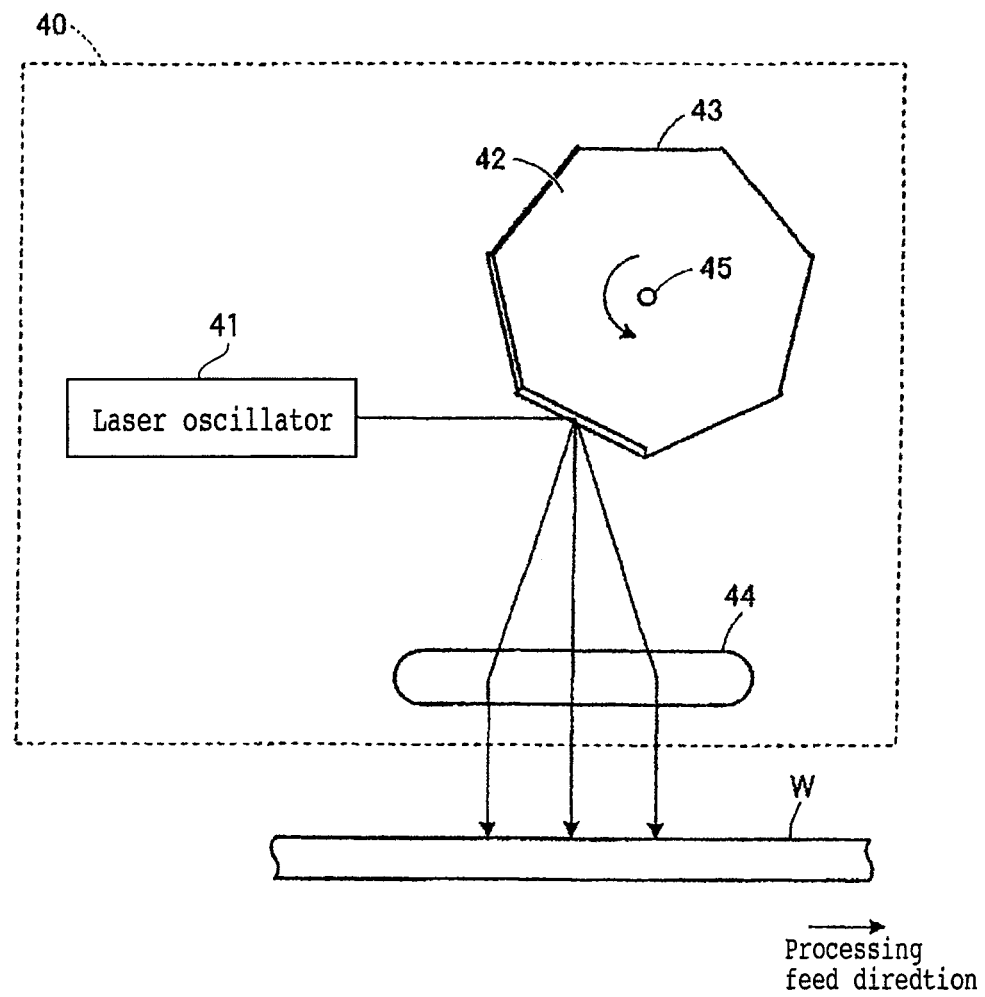
FIG. 3 is a schematic view of a laser optical system according to the embodiment of the present invention.

According to the present embodiment, as depicted in FIG. 3, the laser processing unit 40 includes a polygon mirror 42 having a plurality of reflecting surfaces 43 which include not only reflecting surfaces lying parallel to a central axis 45 about which the polygon mirror 42 rotates, but also reflecting surfaces having different gradients, as described later. When the polygon mirror 42 rotates about the central axis 45, it reflects a laser beam and swings the laser beam in directions perpendicular to the direction in which a wafer W is processing-fed within the width of a projected dicing line L thereon and also in the direction in which the wafer W is processing-fed. As an ablation process is performed on the wafer W by the laser beam while the laser beam traverses across the projected dicing line L, it is not necessary to processing-feed the wafer W repeatedly in reciprocating strokes along the projected dicing line L. Therefore, the period of time required to perform the ablation process on the wafer W is reduced.

Figure 4:
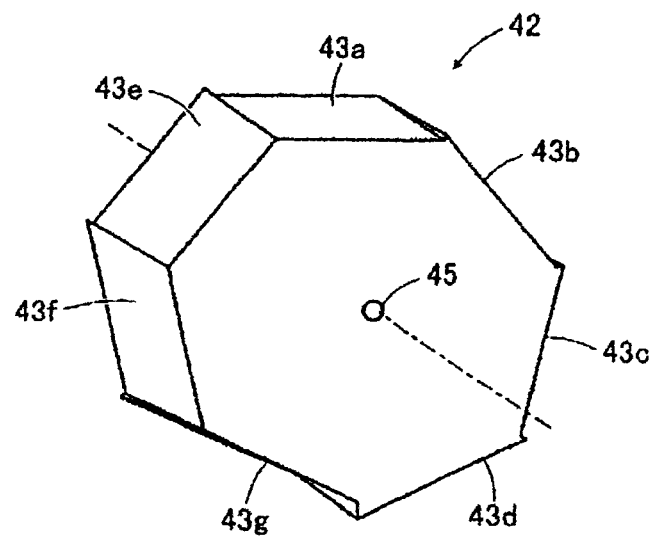
FIG. 4 is a perspective view of a polygon mirror according to the embodiment of the present invention.

A laser optical system incorporated in the laser processing unit 40 will be described below with reference to FIGS. 3 and 4. FIG. 3 is a schematic view of the laser optical system according to the embodiment of the present invention. FIG. 4 is a perspective view of the polygon mirror 42 according to the embodiment of the present invention, incorporated in the laser optical system. FIG. 4 depicts the polygon mirror 42 by way of example only. According to the present invention, a polygon mirror for use in the laser optical system may be of a polygonal shape including a zero-gradient reflecting surface, negative-gradient reflecting surfaces, and positive-gradient reflecting surfaces, as described later.

As depicted in FIG. 3, the laser optical system, which is incorporated in the laser processing unit 40, includes a laser oscillator 41 for emitting a laser beam. The laser beam emitted from the laser oscillator 41 is applied to and reflected by the reflecting surfaces 43 of the polygon mirror 42. The laser beam reflected by the polygon mirror 42 is focused by an fθ lens 44 onto the wafer W. Specifically, the laser oscillator 41 emits a laser beam having a wavelength that can be absorbed by the wafer W toward the polygon mirror 42. The central axis 45 of the polygon mirror 42 extends in a direction perpendicular to the direction in which the wafer W is processing-fed, i.e., the processing feed direction. The reflecting surfaces 43, which are disposed on the outer periphery of the polygon mirror 42, reflect the laser beam toward the fθ lens 44. When the polygon mirror 42 rotates about the central axis 45, the laser beam swings in the processing feed direction along the projected dicing line L and also traverses across the projected dicing line L.

The reflecting surfaces 43 of the polygon mirror 42 are inclined at different angles or gradients to the central axis 45 for causing the laser beam to traverse across the projected dicing line L perpendicularly to the processing feed direction along the projected dicing line L. The fθ lens 44 focuses the laser beam reflected by the reflecting surfaces 43 of the polygon mirror 42 perpendicularly onto the wafer W. Accordingly, the polygon mirror 42 as it rotates about the central axis 45 varies the position of the laser beam on the fθ lens 44, moving the spot of the laser beam focused by the fθ lens 44 transversely across the projected dicing line L (see FIGS. 5A through 5E) within the width thereof.

As depicted in FIG. 4, the reflecting surfaces 43 of the polygon mirror 42 include reflecting surfaces inclined at positive gradients from a zero gradient that represents a direction parallel to the central axis 45 and reflecting surfaces inclined at negative gradients from the zero gradient. Specifically, the reflecting surfaces 43 include a zero-gradient reflecting surface 43*a* lying parallel to the central axis 45, three positive-gradient reflecting surfaces 43*b* to 43*d* that are inclined at positive gradients from the zero gradient, and three negative-gradient reflecting surfaces 43*e* to 43*g* that are inclined at negative gradients from the zero gradient. The positive-gradient reflecting surfaces 43*b* to 43*d* are inclined at respective three positive gradients from the zero gradient, whereas the negative-gradient reflecting surfaces 43*e* to 43*g* are inclined at respective three negative gradients from the zero gradient.

When the laser beam from the laser oscillator 41 is reflected by the zero-gradient reflecting surface 43*a*, the laser beam is applied to the transverse center of the projected dicing line L (see FIGS. 5A through 5E). When the laser beam is reflected by the positive-gradient reflecting surfaces 43*b* to 43*d*, the laser beam is swung toward one transverse side of the projected dicing line L. When the laser beam is reflected by the negative-gradient reflecting surfaces 43*e* to 43*g*, the laser beam is swung toward the other transverse side of the projected dicing line L. As the polygon mirror 42 rotates to bring the reflecting surfaces 43 inclined at the different gradients successively to a position where they reflect the laser beam, the laser beam reflected by the polygon mirror 42 repeatedly traverses across the projected dicing line L.

Figure 5A:
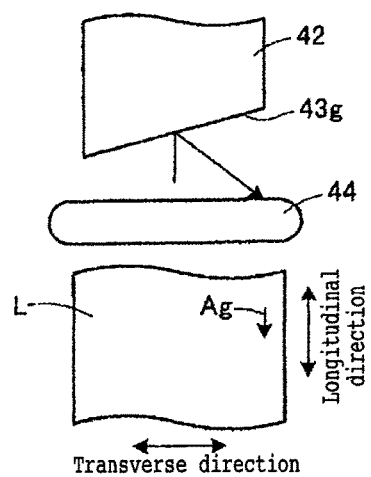
FIGS. 5A through 5E are schematic views illustrating by way of example a laser processing process according to the embodiment of the present invention.
Figure 5B:
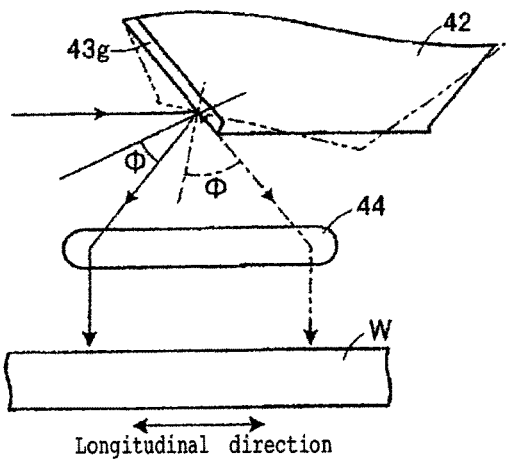

Upon rotation of the polygon mirror 42, an angle φ of reflection by which the reflecting surfaces 43 reflect the laser beam varies as viewed along the central axis 45, as depicted in FIG. 5B. When the angle φ of reflection by which the reflecting surfaces 43 reflect the laser beam varies upon rotation of the polygon mirror 42, the laser beam reflected by the polygon mirror 42 moves longitudinally of the projected dicing line L. Because of the different gradients of the reflecting surfaces 43 with respect to the central axis 45 and the varying angle φ of reflection by which the reflecting surfaces 43 reflect the laser beam upon rotation of the polygon mirror 42, the focused spot of the laser beam on the wafer W is moved transversely and longitudinally within the projected dicing line L.

As the polygon mirror 42 rotates at a higher speed, the reflecting surfaces 43 inclined at the different gradients switch faster to reflect the laser beam, and the angle φ of reflection by which the reflecting surfaces 43 reflect the laser beam varies faster. Accordingly, an increase in the speed at which the polygon mirror 42 rotates results in an increase in the speeds at which the laser beam is swung transversely and longitudinally of the projected dicing line L. Since the speeds at which the laser beam is swung can thus be adjusted by adjusting the speed at which the polygon mirror 42 rotates, the laser optical system according to the present embodiment is simpler than a system incorporating galvano scanners or the like, and the speeds at which the laser beam is swung can be increased.

The laser processing process according to the present embodiment will be described below with reference to FIGS. 5A through 5E and 6A through 6C. FIGS. 5A through 5E are schematic views illustrating by way of example the laser processing process according to the embodiment of the present invention, and FIGS. 6A through 6C are schematic views illustrating by way of example a process of adjusting a width to be traversed by a laser beam according to the embodiment of the present invention. Arrows on the projected dicing line L illustrated in FIGS. 5A, 5C through 5E, and 6A indicate the trajectories of focused spots of laser beams applied to the wafer W to form a processed groove. For illustrative purposes, only the arrows indicating the laser beam spot trajectories for forming a processed groove are illustrated on the projected dicing line L, and the processed groove is omitted from illustration.

When the laser processing process is started, as depicted in FIG. 5A, the polygon mirror 42 is rotated and the laser beam is applied to the reflecting surfaces 43 of the polygon mirror 42. When laser beam is reflected by the negative-gradient reflecting surface 43*g* of the polygon mirror 42, the reflected laser beam is applied to a right area of the fθ lens 44 as illustrated in FIG. 5A because the reflecting surface 43*g* is inclined at a negative gradient with respect to the central axis 45 (see FIG. 4). The laser beam then passes through the fθ lens 44 and is focused thereby onto a right transverse side area of the projected dicing line L on the wafer W (see FIG. 5B). As depicted in FIG. 5A, the laser beam performs an ablation process on the wafer W to form a processed groove therein along a first arrow Ag from a right transverse edge of the projected dicing line L.

At this time, as depicted in FIG. 5B, since the polygon mirror 42 is rotated, the angle φ of reflection by which the reflecting surface 43g reflects the laser beam varies as viewed in side elevation, or in other words, the laser beam is swung in a longitudinal direction of the projected dicing line L by the rotating polygon mirror 42, as depicted in FIG. 5B. Specifically, when the laser beam is reflected by the reflecting surface 43g at a smaller angle φ of reflection, the laser beam is applied to an area of the fθ lens 44 which is closer to the viewer of FIG. 5A, and when the laser beam is reflected by the reflecting surface 43g at a larger angle φ of reflection, the laser beam is applied to an area of the fθ lens 44 which is more remote from the viewer of FIG. 5A. Since the position at which laser beam is applied to the fθ lens 44 is thus moved by the swinging of the laser beam, the focused spot of the laser beam on the wafer W is also moved in the longitudinal direction of the projected dicing line L, performing an ablation process on the wafer W.

Figure 5C:
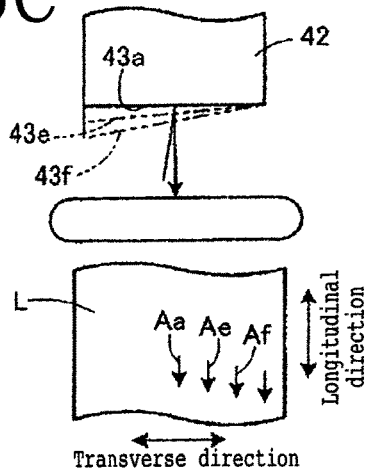
Figure 6A:
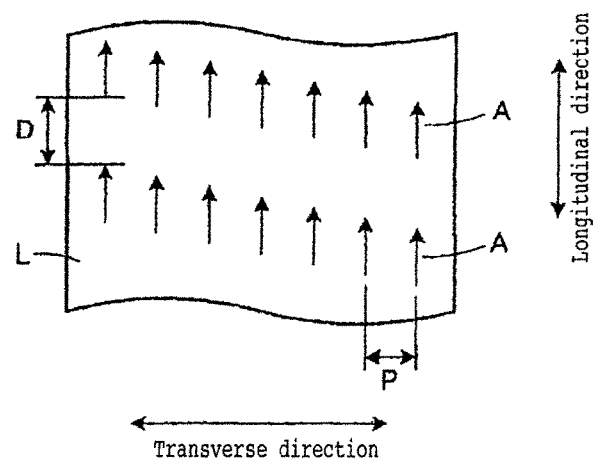
FIGS. 6A through 6C are schematic views illustrating by way of example a process of adjusting a width to be traversed by a laser beam according to the embodiment of the present invention.
Figure 6B:
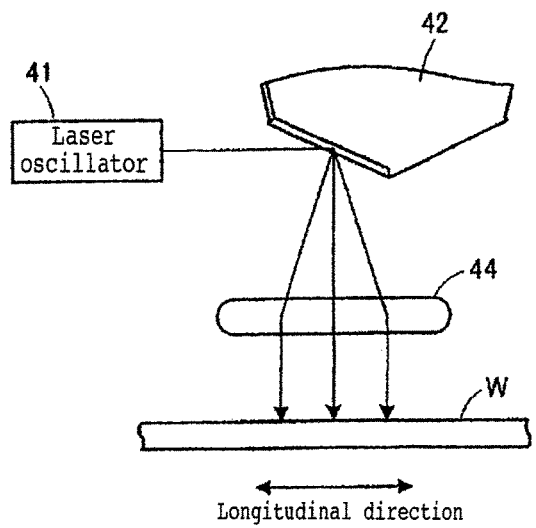
Figure 6C:
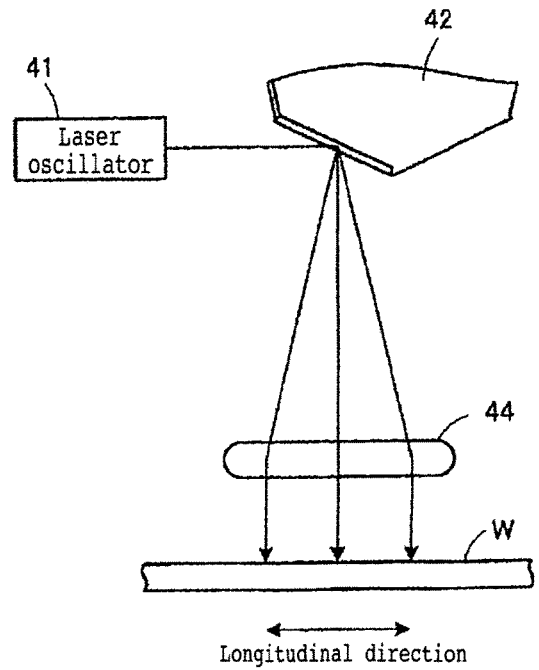

When the polygon mirror 42 is further rotated, as depicted in FIG. 5C, the laser beam is reflected by the negative-gradient reflecting surface 43f of the polygon mirror 42 and applied to the wafer W, performing an ablation process on the wafer W to form a processed groove therein along a second arrow Af from the right transverse edge of the projected dicing line L. Similarly, when the laser beam is reflected by the negative-gradient reflecting surface 43e of the polygon mirror 42 upon further rotation of the polygon mirror 42, the laser beam is applied to the wafer W, performing an ablation process on the wafer W to form a processed groove therein along a third arrow Ae from the right transverse edge of the projected dicing line L. Inasmuch as the wafer W is simultaneously processing-fed in the longitudinal direction of the projected dicing line L, the processed grooves thus formed are slightly staggered in the longitudinal direction of the projected dicing line L. When the laser beam is reflected by the zero-gradient reflecting surface 43a, the laser beam performs an ablation process on the wafer W to form a processed groove therein along a fourth arrow Aa at the transverse center of the projected dicing line L.

Figure 5D:
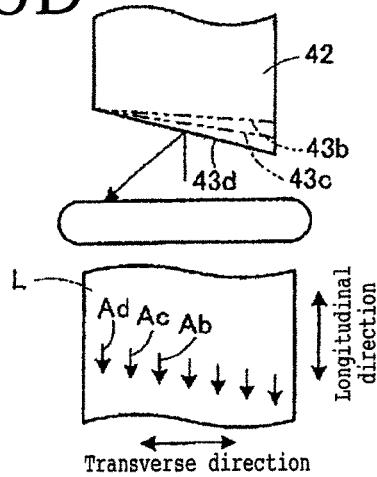

When the polygon mirror 42 is further rotated, as depicted in FIG. 5D, the laser beam is reflected by the positive-gradient reflecting surface 43b of the polygon mirror 42 and applied to the wafer W, performing an ablation process on the wafer W to form a processed groove therein along a third arrow Ab from a left transverse edge of the projected dicing line L. Similarly, when the laser beam is reflected by the positive-gradient reflecting surface 43c of the polygon mirror 42 upon further rotation of the polygon mirror 42, the laser beam is applied to the wafer W, performing an ablation process on the wafer W to form a processed groove therein along a second arrow Ac from the left transverse edge of the projected dicing line L. When the laser beam is reflected by the positive-gradient reflecting surface 43d, the laser beam performs an ablation process on the wafer W to form a processed groove therein along a first arrow Ad from the left transverse edge of the projected dicing line L. In this manner, as many processed grooves as the number of the reflecting surfaces 43 of the polygon mirror 42 are formed in an oblique array within the width of the projected dicing line L.

Figure 5E:
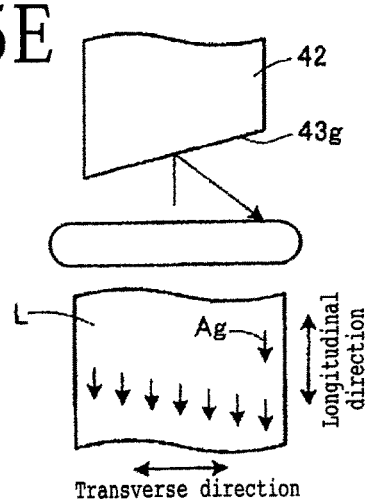

When the polygon mirror 42 is further rotated, as depicted in FIG. 5E, the laser beam is reflected by the negative-gradient reflecting surface 43g again and applied to the wafer W, forming a processed groove along the arrow Ag in a second array in the right transverse side area of the projected dicing line L. The above process is repeated to form a plurality of processed grooves in the wafer W that are spaced transversely across the projected dicing line L, in a plurality of arrays that are spaced longitudinally along the projected dicing line L. As described above, the polygon mirror 42 whose reflecting surfaces 43 have different gradients to the central axis 45 (see FIG. 4) reflects the laser beam to move the focused spot of the laser beam in the processing feed direction, i.e., in the longitudinal direction of the projected dicing line L, and in the direction perpendicular thereto, i.e., in the transverse direction of the projected dicing line L.

As depicted in FIG. 6A, the processed grooves, indicated by arrows A, that are spaced at a pitch P are formed transversely across the projected dicing line L, and the arrays of the processed grooves A that are spaced at an interval D are formed longitudinally along the projected dicing line L. In order to increase the quality of the laser processing process, it is preferable to reduce the pitch P and the interval D so that processed grooves will be formed without substantial gaps therebetween on the projected dicing line L. The pitch P may be reduced by increasing the number of the reflecting surfaces 43 (see FIG. 4) of the polygon 42 to provide the polygon 42 with more gradients to the central axis 45 thereof.

Specifically, according to the present embodiment, the polygon mirror 42 has a total of seven reflecting surfaces 43 including the zero-gradient reflecting surface 43a lying parallel to the central axis 45, the three positive-gradient reflecting surfaces 43b to 43d that are inclined at the positive gradients to the central axis 45, and the three negative-gradient reflecting surfaces 43e to 43g that are inclined at the negative gradients to the central axis 45. Therefore, the laser beam is reflected by the seven reflecting surfaces 43 with the different gradients (see FIGS. 5A through 5E). In order to reduce the pitch P, the laser optical system incorporated in the laser processing unit 40 may include a polygon mirror having eight or more reflecting surfaces with different gradients for reflecting the laser beam. The laser beam reflected by such a polygon mirror can produce more processing grooves in the wafer W that are spaced a reduced pitch P transversely across the projected dicing line L.

The speed at which the chuck table 20 is moved, i.e., the speed at which the wafer W (see FIG. 1) is processing-fed, may be lowered to reduce the interval D between the arrays of processed grooves that are spaced longitudinally along the projected dicing line L. Furthermore, the speed at which the polygon mirror 42 (see FIG. 4) is rotated may be increased to reduce the interval D between the arrays of processed grooves that are spaced longitudinally along the projected dicing line L. By thus increasing the speed at which the polygon mirror 42 is rotated relatively to the speed at which the wafer W is processing-fed, the number of times that the laser beam is applied to the wafer W longitudinally along the projected dicing line L is increased to form more processed grooves longitudinally along the projected dicing line L.

Moreover, as depicted in FIG. 6C, the distance between the polygon mirror 42 and the fθ lens 44 may be increased to reduce the interval D between the arrays of processed grooves longitudinally along the projected dicing line L. If the distance between the polygon mirror 42 and the fθ lens 44 is smaller, as depicted in FIG. 6B, then the distance that the laser beam is swung longitudinally along the projected dicing line L is smaller. On the other hand, if the distance between the polygon mirror 42 and the fθ lens 44 is larger, as depicted in FIG. 6C, then the distance that the laser beam is swung longitudinally along the projected dicing line L is larger. The larger distance that the laser beam is swung longitudinally along the projected dicing line L reduces the interval D between the arrays of processed grooves.

In the laser processing apparatus 1 according to the present embodiment, as described above, when the laser beam is applied to the polygon mirror 42 that is rotating about the central axis 45, the laser beam is reflected successively by the zero-gradient reflecting surface 43a, the positive-gradient reflecting surfaces 43b to 43d, and the negative-gradient reflecting surfaces 43e to 43g. As the zero-gradient reflecting surface 43a, the positive-gradient reflecting surfaces 43b to 43d, and the negative-gradient reflecting surfaces 43e to 43g switch to reflect the laser beam upon rotation of the polygon mirror 42, the laser beam is swung within the width of the projected dicing line L in the direction perpendicular to the processing feed direction. In addition, the angle of reflection by which each of the reflecting surfaces 43 reflects the laser beam varies upon rotation of the polygon mirror 42, swinging the laser beam in the processing feed direction. The speed at which the laser beam is swung is determined depending on the speed at which the polygon mirror 42 is rotated. Therefore, the laser beam can be swung and the speed at which the laser beam is swung can be increased by a simple arrangement.

In the illustrated embodiment, the laser optical system incorporated in the laser processing unit 40 is made up of the laser oscillator 41, the polygon mirror 42, and the fθ lens 44. However, the laser optical system is not limited to such an arrangement. The laser optical system may be configured to swing the laser beam within the width of the projected dicing line in the direction perpendicular to the processing feed direction and also in the processing feed direction.

In the illustrated embodiment, the reflecting surfaces 43 of the polygon mirror 42 are arrayed in the order of magnitudes of their gradients to the central axis 45, along the direction in which the polygon mirror 42 is rotated. However, the reflecting surfaces 43 are not limited to such an arrangement. The reflecting surfaces of the polygon mirror may be inclined at various angles or gradients to the central axis thereof. For example, the polygon mirror may have positive-gradient reflecting surfaces and negative-gradient reflecting surfaces that alternate with each other.

In the illustrated embodiment, the central axis 45 of the polygon mirror 42 extends perpendicularly to the projected dicing line L. However, the central axis 45 of the polygon mirror is not limited to such an arrangement. The central axis of the polygon mirror may extend across or parallel to the projected dicing line.

In the illustrated embodiment, the processed grooves are formed in the wafer W by the laser processing process. The processed grooves are not limited to grooves that fully sever the wafer W, but may be grooves that partly cut into the wafer W. In other words, the processed grooves may be full-cut grooves or half-cut grooves.

In the illustrated embodiment, the wafer W may be a semiconductor wafer or an optical device wafer, for example. However, the wafer may be a packaged substrate such as a chip-scale package (CSP) substrate with projected dicing lines formed thereon.

In the illustrated embodiment, the processing feed unit 30 is illustrated as ball-screw moving mechanisms. However, the processing feed unit 30 is not limited to such an arrangement. The processing feed unit may be any mechanisms for processing-feeding the chuck table and the laser processing unit relatively to each other. For example, the processing feed unit may be a linear-motor moving mechanism or a rack-and-pinion moving mechanism.

The present invention is not limited to the embodiment and modifications described above. Various changes, replacements, and modifications may be made without departing from the scope of the present invention. Furthermore, the present invention may be reduced to practice according to other techniques, processes, schemes, plans, or arrangements insofar as they are capable of implementing the principles of the present invention owing to technological advances or derivations. Therefore, the scope of the appended claim should be interpreted as covering all the embodiments falling within the range of the technical idea of the present invention.

In the illustrated embodiment, the present invention has been described as being applied to the laser processing apparatus that performs an ablation process on a wafer along projected dicing lines on the wafer. However, the principles of the present invention are also applicable to other processing apparatus for processing a workpiece with a laser beam while swinging the laser beam.

As described above, the present invention is advantageous in that a laser beam can be swung transversely across a projected dicing line and the speed at which the laser beam is swung can be increased by a simple arrangement, and is particularly useful when applied to a laser processing apparatus for processing a wafer having a low-k film with a laser beam.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A laser processing apparatus for processing a wafer with a laser beam which is focused and applied to the wafer along a plurality of intersecting projected dicing lines on a surface thereof which demarcate the surface into a plurality of areas with devices formed therein, comprising:
   a chuck table configured to hold the wafer thereon;
   a laser processing unit configured to focus and apply a laser beam having a wavelength that can be absorbed by the wafer, along the projected dicing lines on the wafer held on said chuck table; and
   a processing feed unit configured to processing-feed said chuck table and said laser processing unit relatively to each other in a processing feed direction,
   wherein said laser processing unit includes
      a laser oscillator for emitting the laser beam,
      a polygon mirror rotatable about a central axis thereof and having a plurality of reflecting surfaces, and
      an fθ lens for focusing the laser beam reflected by the reflecting surfaces of said polygon mirror and applying the focused laser beam to the wafer,
      said reflecting surfaces of said polygon mirror include
         a zero-gradient reflecting surface lying at a zero gradient parallel to said central axis, at least one positive-gradient reflecting surface that is inclined at a positive gradient from the zero gradient and nonparallel to said central axis, and at least one negative-gradient reflecting surface that is inclined at a negative gradient from the zero gradient and nonparallel to said central axis, and
   wherein said polygon mirror swings said laser beam in a direction perpendicular to said processing feed direction within a width of each of said projected dicing lines and in said processing feed direction to form at least one row of grooves within the each projected dicing line.

2. The laser processing apparatus for processing a wafer as defined in claim 1, wherein a plurality of said positive-gradient reflecting surfaces are arranged adjacent to each other and a plurality of negative-gradient reflecting surfaces are arranged adjacent to each other.

3. The laser processing apparatus for processing a wafer as defined in claim 1, wherein a plurality of said positive-gradient reflecting surfaces and a plurality of negative-gradient reflecting surfaces are provided and arranged so that each positive-gradient reflecting surface and each negative-gradient reflecting surface alternate on the polygon mirror.

4. The laser processing apparatus for processing a wafer as defined in claim 1, wherein the number of grooves in each of the at least one row of grooves correspond to a total of the number of zero-gradient reflecting surface, the at least one positive-gradient reflecting surface and the at least one negative-gradient reflecting surface.

5. The laser processing apparatus for processing a wafer as defined in claim 1, wherein a plurality of rows of grooves are formed in the each projected dicing line with the rows of grooves being spaced from each other at a predetermined interval longitudinally along the each projected dicing line.

* * * * *